(12) United States Patent
Huang

(10) Patent No.: US 8,722,450 B1
(45) Date of Patent: May 13, 2014

(54) METHOD FOR MANUFACTURING IMPROVED SOLAR CELL MODULE

(71) Applicant: Perfect Source Technology Corp., Taoyuan County (TW)

(72) Inventor: Po-Chung Huang, Taoyuan County (TW)

(73) Assignee: Perfect Source Technology Corp., Taoyuan County (TW)

( * ) Notice: Subject to any disclaimer, the term of this patent is extended or adjusted under 35 U.S.C. 154(b) by 0 days.

(21) Appl. No.: 13/845,345

(22) Filed: Mar. 18, 2013

(51) Int. Cl.
*H01L 31/048* (2014.01)
*H01L 31/02* (2006.01)
*H01L 25/04* (2014.01)

(52) U.S. Cl.
CPC ...... *H01L 31/0485* (2013.01); *H01L 31/02013* (2013.01); *H01L 25/042* (2013.01)
USPC .................................... 438/67; 257/E31.117

(58) Field of Classification Search
CPC ... H01L 31/048; H01L 31/05; H01L 2224/97; H01L 31/042; H01L 31/0504; H01L 31/022425; H01L 2224/85; H01L 27/14634; H01L 31/02008; H01L 31/0481; H01L 2924/16195; H01L 31/02021; H01L 31/0687; H01L 31/076; H01L 25/045
USPC ...................................................... 438/64–66
See application file for complete search history.

(56) References Cited

U.S. PATENT DOCUMENTS

| | | | |
|---|---|---|---|
| 6,340,403 B1 * | 1/2002 | Carey et al. .................... | 156/182 |
| 6,670,787 B2 * | 12/2003 | Tachibana ..................... | 320/101 |
| 8,586,855 B2 * | 11/2013 | Park ............................... | 136/244 |
| 2011/0111534 A1 * | 5/2011 | Gudel et al. .................... | 438/15 |
| 2011/0232748 A1 * | 9/2011 | Shimizu et al. ................ | 136/256 |
| 2012/0073629 A1 * | 3/2012 | Wu et al. ........................ | 136/251 |
| 2012/0103388 A1 * | 5/2012 | Meakin et al. ................. | 136/244 |

* cited by examiner

*Primary Examiner* — W. Wendy Kuo
*Assistant Examiner* — Herve Assouman
(74) *Attorney, Agent, or Firm* — Bacon & Thomas, PLLC

(57) ABSTRACT

The present invention generally relates to a method for manufacturing an improved solar cell module, more particularly to a method for manufacturing the improved solar cell module that may not happen problems of power leakage and short circuit and save the cost to manufacturing.

11 Claims, 10 Drawing Sheets

METHOD FOR MANUFACTURING IMPROVED SOLAR CELL MODULE

BACKGROUND OF THE INVENTION

1. Field of the Invention

The present invention generally relates to a method for manufacturing an improved solar cell module, more particularly to a method for manufacturing the improved solar cell module that may not happen problems of power leakage and short circuit.

2. Description of the Prior Art

Among the recent world spread consciousness of ecological and environmental protection issues, the deepest concern is directed to the warming of the earth by $CO_2$ production, and the development and stable supply of clean energy are urgently desired objectives. The solar cell is one of the most promising clean energy sources because of its safety and ease of handling. Solar cells have been prepared in various forms such as (a) monocrystalline silicon solar cells; (b) polycrystalline silicon solar cells; (c) amorphous silicon solar cells; (d) copper-indium selenide solar cells; and (e) compound semiconductor solar cells. Among these types of cells, the thin film crystalline silicon solar cells, compound semiconductor solar cells, and amorphous silicon solar cells are recent targets of active development as they are relatively inexpensive and can be formed into a large area.

Traditional manufacturing processes of solar cell modules have the steps of: (a) making a plurality of solar cell strings; (b) arranging the solar cell strings to be a solar cell matrix; (3) processing lamination process with a piece of glass as front sheet, first ethylene-vinyl acetate (EVA) as isolating cover, the solar cell matrix, second ethylene-vinyl acetate (EVA) as isolating cover, and back sheet in series; (4) wiring the laminated solar cell matrix with a junction box; and (5) assembling the laminated solar cell matrix with the junction box with an aluminum frame to form the traditional solar cell module. However, there are some problems that need to be improved.

Before the module is in the lamination process, the conductive wires are commonly connected with the junction box by passing through the first EVA, second EVA and back sheet. Some shortcomings follow. First, since the conductive wires go through the first EVA, the second EVA and the back sheet, the EVA, the second EVA and the back sheet need to be punched or cut before lamination process. In order to avoid the solar cell strings from shifting during ribbons, end points of the conductive wires, going through the holes, tapes are required to fix them together. However, the tapes may cause stability problem for the solar cell module in long term.

Secondly, power leakage and even short circuit still exist. When the solar module is under the manufacturing processes, non-insulated cables are commonly used to connect the conductive wires and the junction box. If the conductive wires are too close one another, the solar cell module will easily have power leakage or short circuit between the ribbons when generating electric power. Furthermore, it causes danger to human bodies and fire.

With references to FIG. 12A to FIG. 12D, which illustrate schematic sequential views of forming an isolating member between conductive wires to prevent problems of power leakage and short circuit in prior arts. As shown in FIG. 12A, a front sheet 203' is a bottom layer, a first isolating cover 212a' is beyond the front sheet 203', and a plurality of conductive wire sets 2016' are on the first isolating cover 212a' and defined as another layer that is the same as a layer where the solar cell matrix is on, wherein each of the conductive wire sets 2016' may have a pre-process that is to vertically bend the conductive wire sets 2016', and the pre-process is applicable to electrically connect the conductive wire sets 2016' with a junction box; as shown in FIG. 12B, an isolating member 80' is disposed between two conductive wire sets 2016', each of the conductive wire sets 2016' has one conductive wire 20161' and one conductive wire 20162', wherein the conductive wire 20162' penetrates through a seam 212a5' on the first isolating cover 212a', then it can be seen that the arrangement lets the isolating member 80' isolates the conductive wire 20161' and the conductive wire 20162'; as shown in FIG. 12C, a second isolating cover 212b' is on the layer with the conductive wire sets 2016', so that the isolating member 80', the partial conductive wire 20161' and the partial conductive wire 20162' are shown by dot lines since they are covered by the second isolating cover 212b', but other part of the conductive wire 20161' and other part of the conductive wire 20162' penetrate through a seam 212b5' on the second isolating cover 212b', so that the two parts of the conductive wire 20161' and the conductive wire 20162' are exposed on the second isolating cover 212b'; and as shown in FIG. 12D, a back sheet 205' is added on the second isolating cover 212b, and the two parts of the conductive wire 20161' and the conductive wire 20162' penetrate through a seam 2055' on the back sheet 205' for exposing, so that the exposed parts of the conductive wire 20161' and the conductive wire 20162' are able to electrically connect with a junction box (not shown in figure), and then an adhesive 2054' as silicone is coated on the seam 2055' for seal. As it can be seen, there are three seams 212a5', 212b5' and 2055' in the processes of forming the isolating member between conductive wires. Therefore, the seal may be considered while the solar cell module is assembled. Especially, solar cell module is always exposed under the Sun or stormy and rainy circumstances for quite a long time. Further, the pre-process to vertically bend the conductive wire sets 2016' may increase the cost to manufacturing as well.

However, only new materials used for lamination process can not permanently solve the problems mentioned above. The most important reason is no more care of wired cables in the solar cell structure. Although solar cells can be well protected, protection of wired cables is not considered. The cables will have power leakage or even cause circuit shortage after long time use. Therefore, a method for overcoming the above problems in manufacturing a solar cell module is still desired.

SUMMARY OF THE INVENTION

The main object of the present invention is to provide a method for manufacturing an improved solar cell module, and the solar cell module may figure out the shortcomings of power leakage and short circuit in prior arts and increase the seal level of the improved solar cell module.

The second object of the present invention is to provide the method for manufacturing the improved solar cell module in order to save the cost to manufacturing.

A method for manufacturing an improved solar cell module comprising the steps of: (1) concatenating a plurality of solar cells with a plurality of conductive wires to form a plurality of solar cell strings, arranging the solar cell strings to form a solar cell matrix, and extending each conductive wire to form an extended outer-connection section, then converging the plurality of extended outer-connection sections to a plurality of integrated extended outer-connection sections, wherein the number of the integrated extended outer-connection sections is less than the number of the extended outer-connection sections; (2) forming an isolating cover on a first surface of the solar cell matrix and another isolating cover on a second surface of the solar cell matrix; (3) forming a front sheet on a first surface of the isolating cover and a back sheet on a second surface of the another isolating cover in order to assemble the solar cell module; (4) pressing the front sheet, the isolating cover, the solar cell matrix, the another isolating cover, and the back sheet by way of using lamination technologies and the chemical characteristics of the isolating cover and the another isolating cover; (5) aiming at an end point of each of the integrated extended outer-connection sections, drilling holes from the back sheet and the another isolating cover to the end point on the second surface of the solar cell matrix, so as to form a plurality of holes on the back sheet and a plurality of holes on the another isolating cover, wherein each of the end points is not drilled through and therefore a plurality of end point indentations are formed on the second surface of the solar cell matrix; (6) soldering each of the end point indentations and an insulated cable; (7) coating an adhesive on the soldering location of the end point indentation and the insulated cable; and (8) connecting each of the insulated cables with an junction box.

Other and further features, advantages, and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions, wherein.

DETAILED DESCRIPTION OF THE INVENTION

Following preferred embodiments and figures will be described in detail so as to achieve aforesaid objects.

Figure 1:
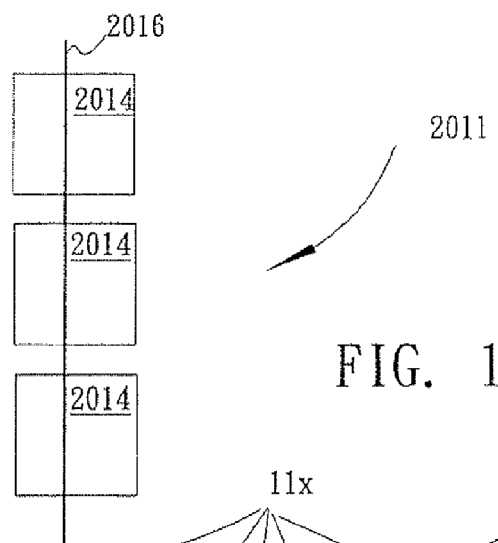
FIG. 1 to FIG. 10 illustrate schematic structural views of the steps of the method for manufacturing an improved solar cell module of the present invention.
Figure 2:
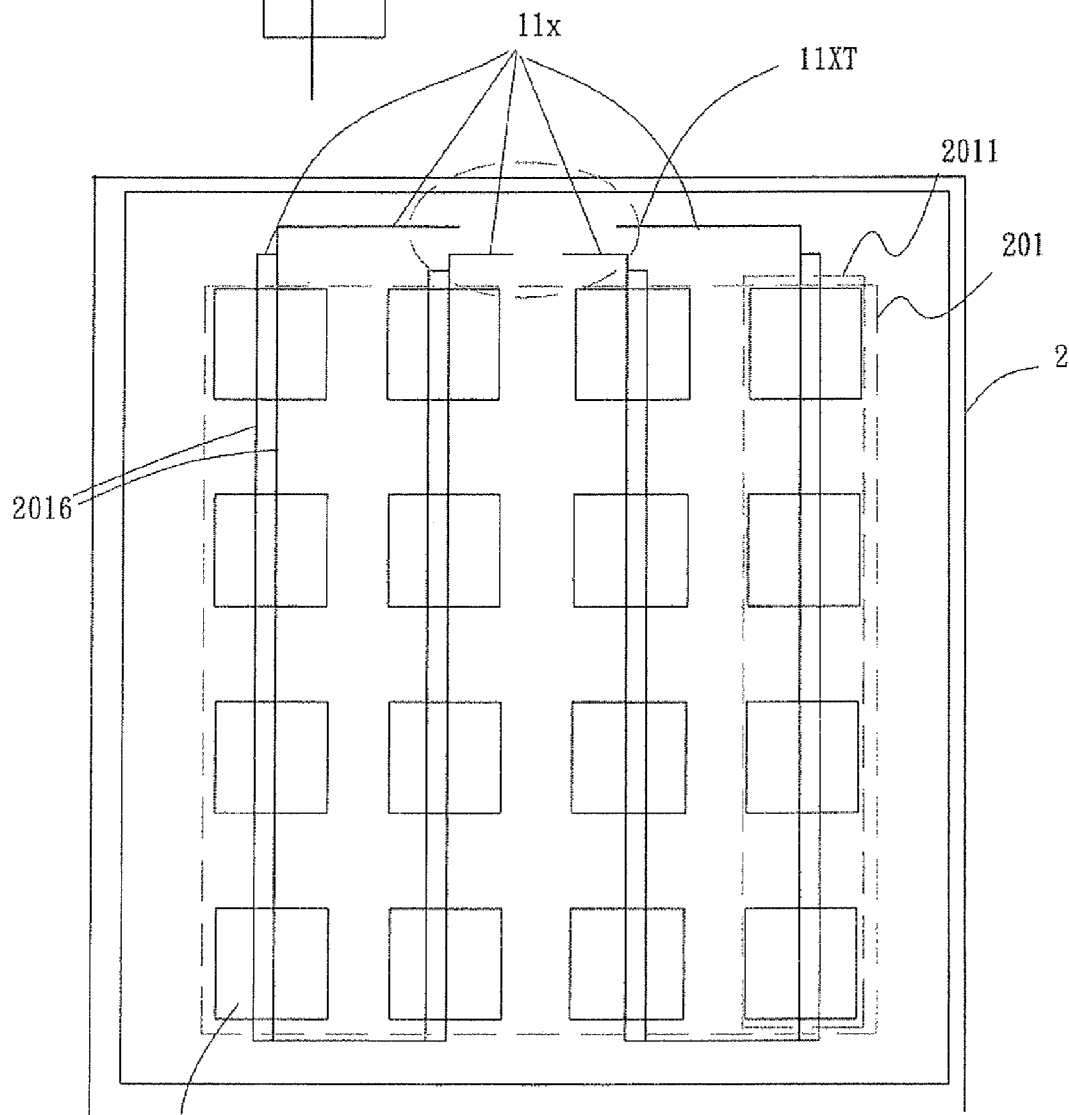
Figure 3:
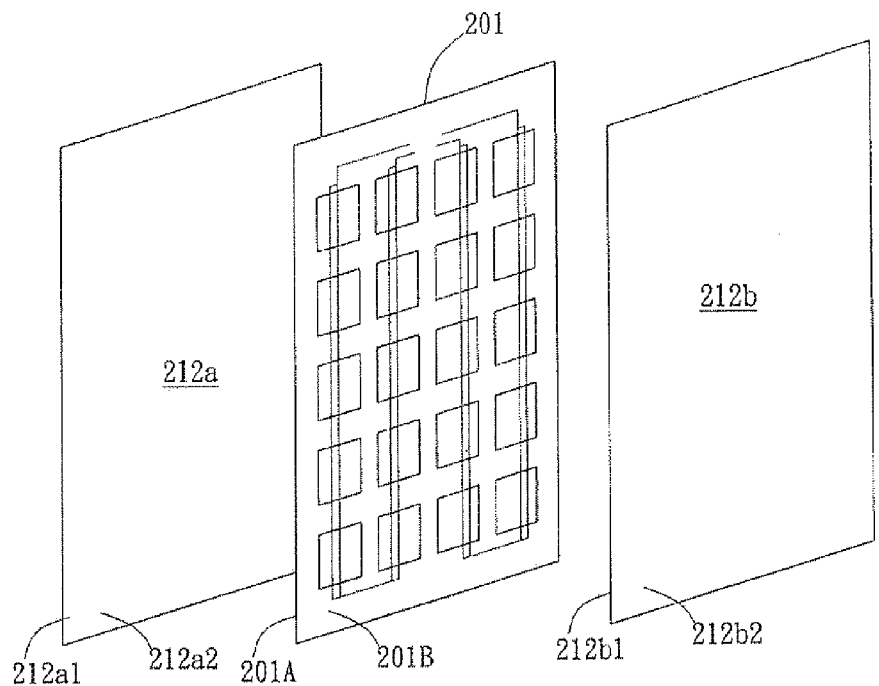
Figure 4:
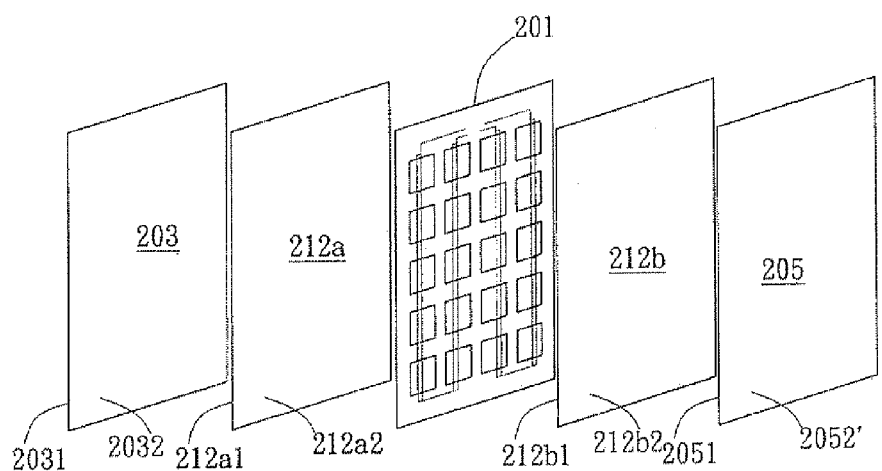
Figure 5:
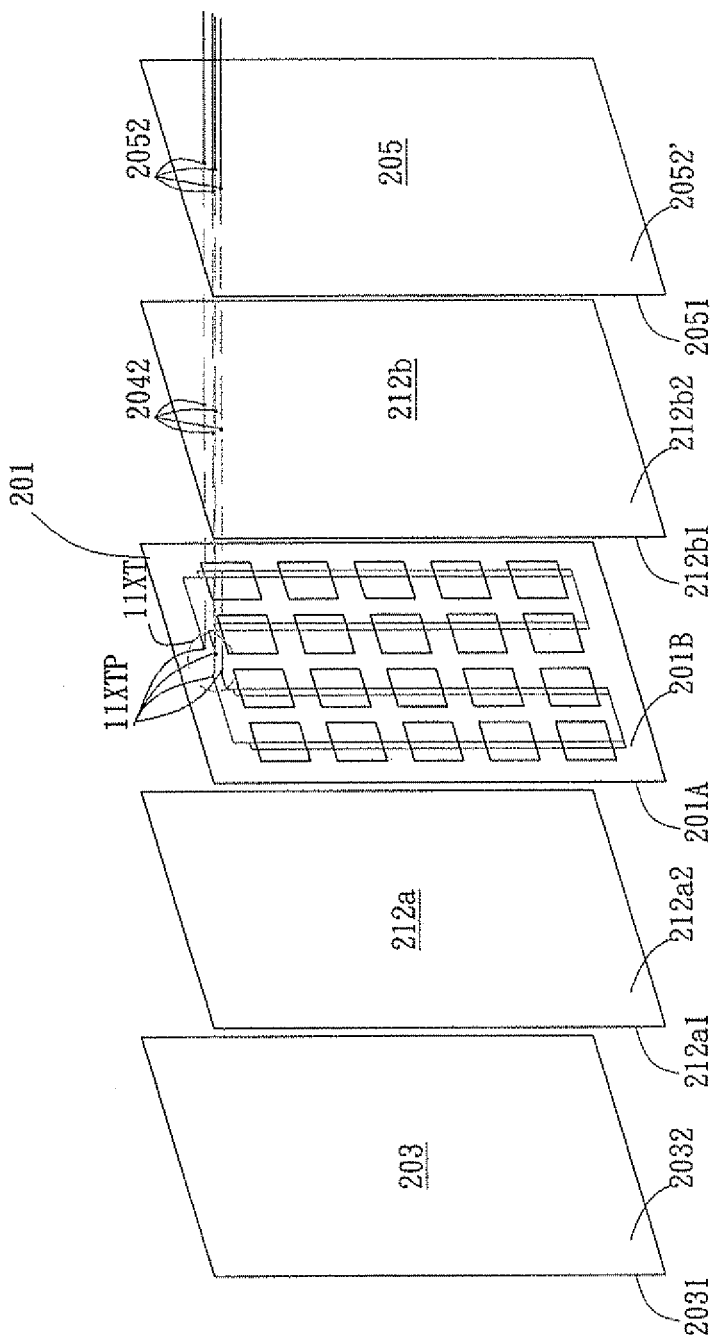
Figure 6:
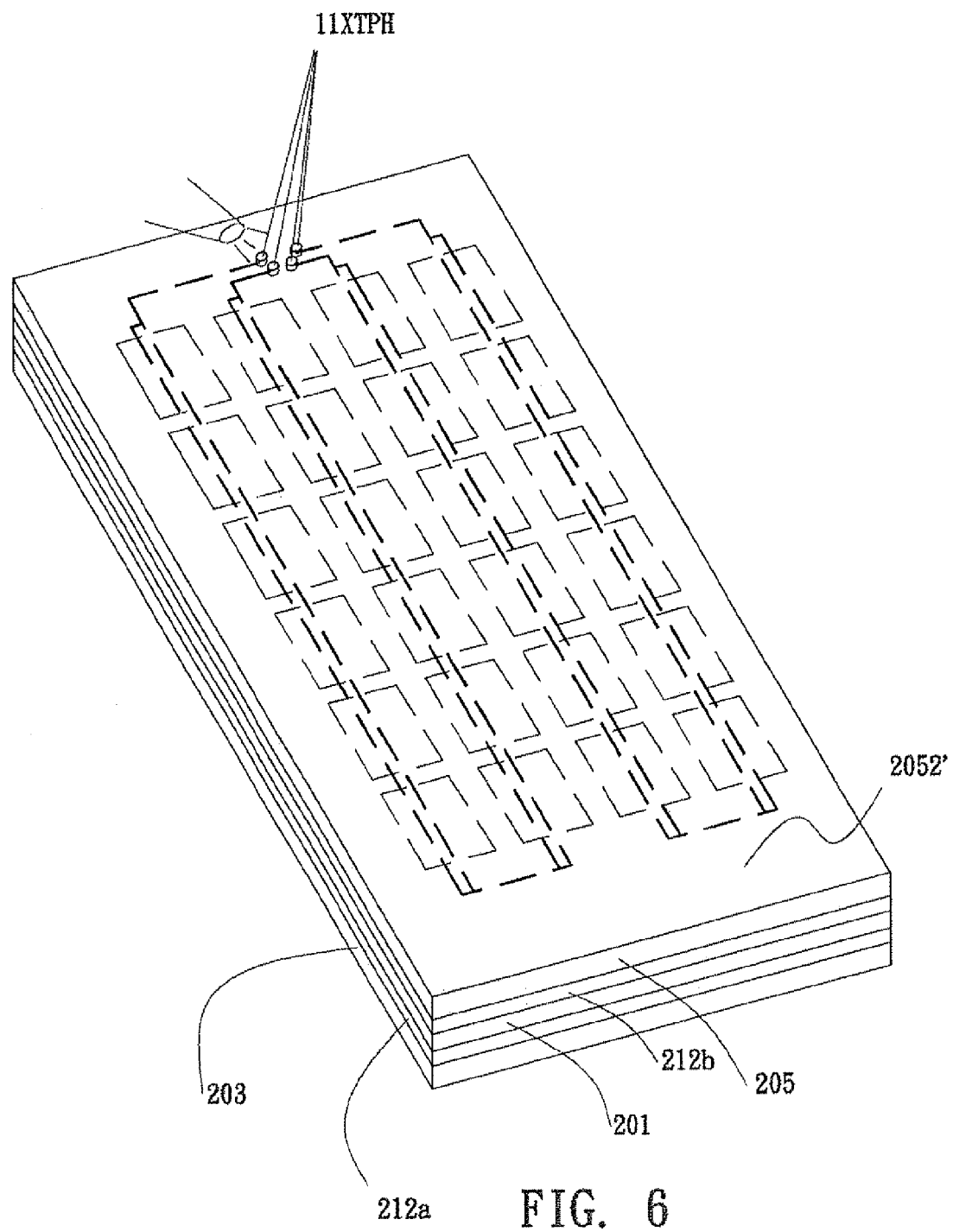
Figure 7:
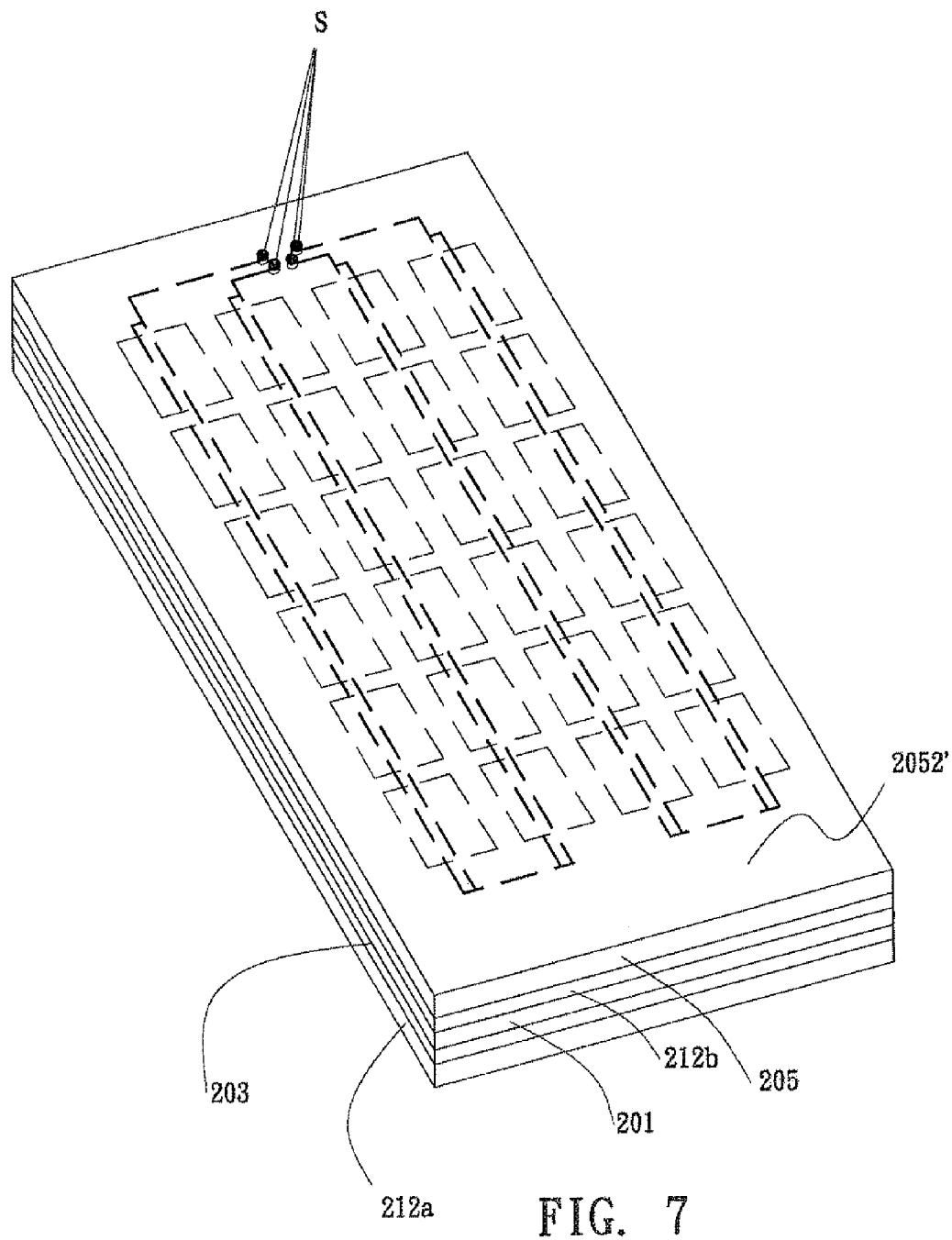
Figure 8:
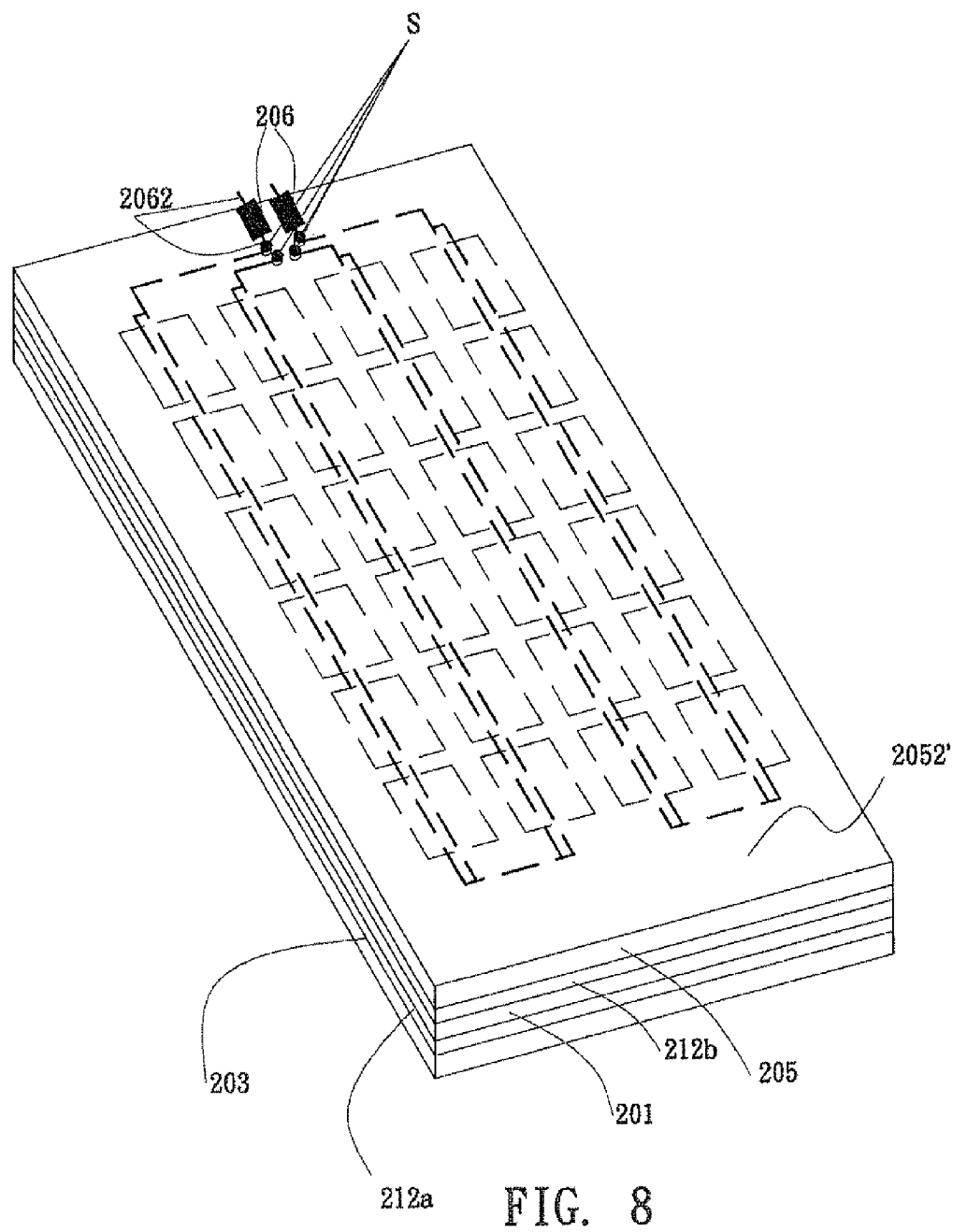
Figure 9:
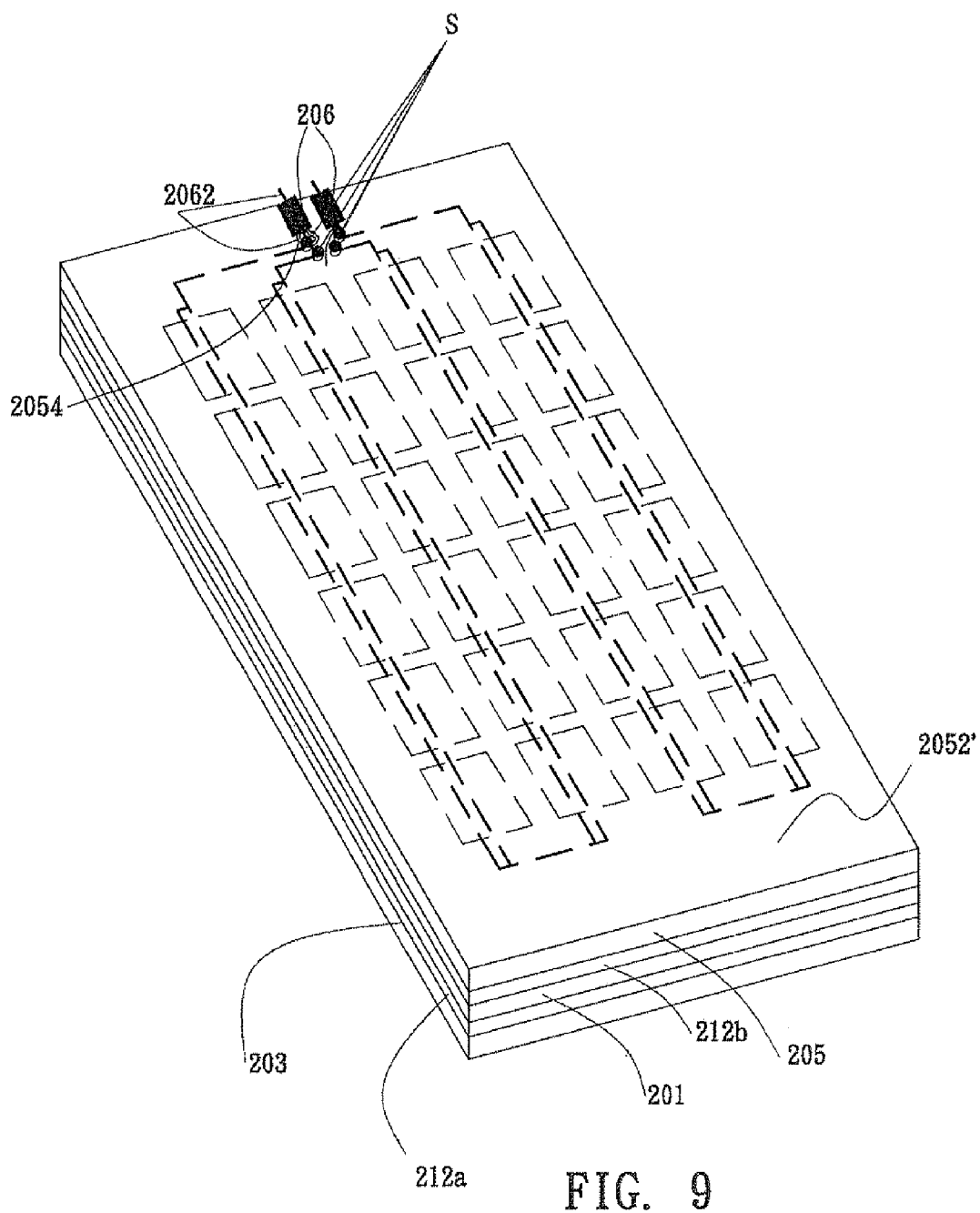

With references to FIG. 1 to FIG. 10 and FIG. 11, which illustrate schematic structural views of the steps of the method for manufacturing an improved solar cell module of the present invention and a flow chart of the method for manufacturing the improved solar cell module of the present invention. As shown in figures, the method includes the steps of:

(1) as shown in FIG. 1, concatenating the plurality of solar cells 2014 with at least one conductive wire 2016 to form the solar cell string 2011 via a concatenating machine, not shown in figure, and then repeating to form more solar cell strings 2011;

(2) as shown in FIG. 2, arranging the solar cell strings 2011 to form the solar cell matrix 201 via a jig, the solar cell matrix 201 having a first surface 201A, not shown in figure, and a second surface 201B, extending each conductive wire 2016 to form the extended outer-connection section 11X, then converging the plurality of extended outer-connection sections 11X to the plurality of integrated extended outer-connection sections 11XT, wherein the number of the integrated extended outer-connection sections 11XT is less than the number of the extended outer-connection sections 11X, the integrated extended outer-connection sections 11XT being on the one side of the second surface 201B of the solar cell matrix 201;

(3) as shown in FIG. 3, forming the isolating cover 212a on the first surface 201A of the solar cell matrix 201 and the another isolating cover 212b on the second surface 201B of the solar cell matrix 201, wherein the isolating cover 212a has a first surface 212a1 and a second surface 212a2 and the another isolating cover 212b has a first surface 212b1 and a second surface 212b2, thus the second surface 212a2 of the isolating cover 212a compounds into the first surface 201A of the solar cell matrix 201, and the first surface 212b1 of the another isolating cover 212b compounds into the second surface 201B of the solar cell matrix 201;

(4) as shown in FIG. 4, forming the front sheet 203 on the first surface 212a1 of the isolating cover 212a and the back sheet 205 on the second surface 212b2 of the another isolating cover 212b in order to assemble the solar cell module 20, wherein the front sheet 203 has a first surface 2031 and a second surface 2032, and the back sheet 205 has a first surface 2051 and a second surface 2052', thus the second surface 2032 of the front sheet 203 compounds into the first surface 212a1 of the isolating cover 212a, and the first surface 2051 of the back sheet 205 compounds into the second surface 212b2 of the another isolating cover 212b;

(5) pressing the front sheet 203, the isolating cover 212a, the solar cell matrix 201, the another isolating cover 212b, and the back sheet 205 in a vacuum chamber, not shown in figure, by way of using lamination technologies and the chemical characteristics of the isolating cover 212a and the another isolating cover 212b, wherein the isolating cover 212a and the another isolating cover 212b are made of EVA (ethylene-vinyl acetate) for the preferred embodiment;

(6) as shown in FIG. 5 and FIG. 6, aiming at the end point 11XTP of each of the integrated extended outer-connection sections 11XT, drilling holes from the second surface 2052' and the first surface 2051 of the back sheet 205 and a second surface 212b2 and a first surface 212b1 of the another isolating cover 212b to the end point 11XTP on the second surface 201B of the solar cell matrix 201, so as to form the plurality of holes 2052 on the back sheet 205 and the plurality of holes 2042 on the another isolating cover 212b, wherein each of the end points 11XTP is not drilled through so as to leave a copper layer, not shown in figure, exposed in the end point indentation 11XTPH and therefore the plurality of end point indentations 11XTPH are formed on the second surface 201B of the solar cell matrix 201;

(7) as shown in FIG. 6, using high-pressure air and cleaning solution, not shown in figure, to clean up a location where the end point indentations 11XTPH are on the second surface 2052' of the back sheet 205;

(8) as shown in FIG. 7, forming a soldering ball S on the copper layer, not shown in figure, of each of the end point indentations 11XTPH;

(9) as shown in FIG. 8, soldering the soldering ball S and a core 2062 of the insulated cable 206;

(10) as shown in FIG. 9, coating an adhesive 2054 as silicone on the soldering location of the end point indentation 11XTPH and the insulated cable 206; and

Figure 10:
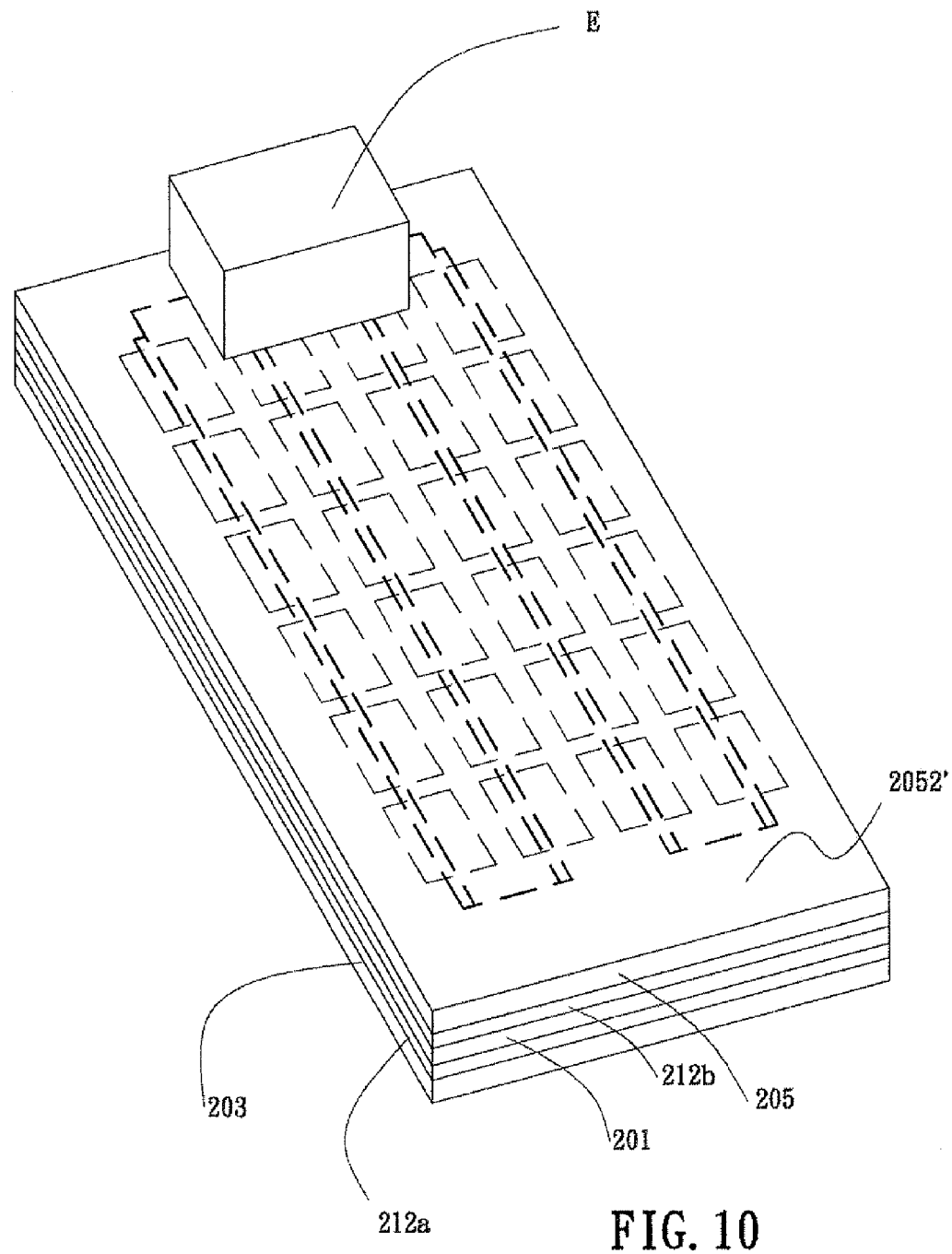
Figure 11:
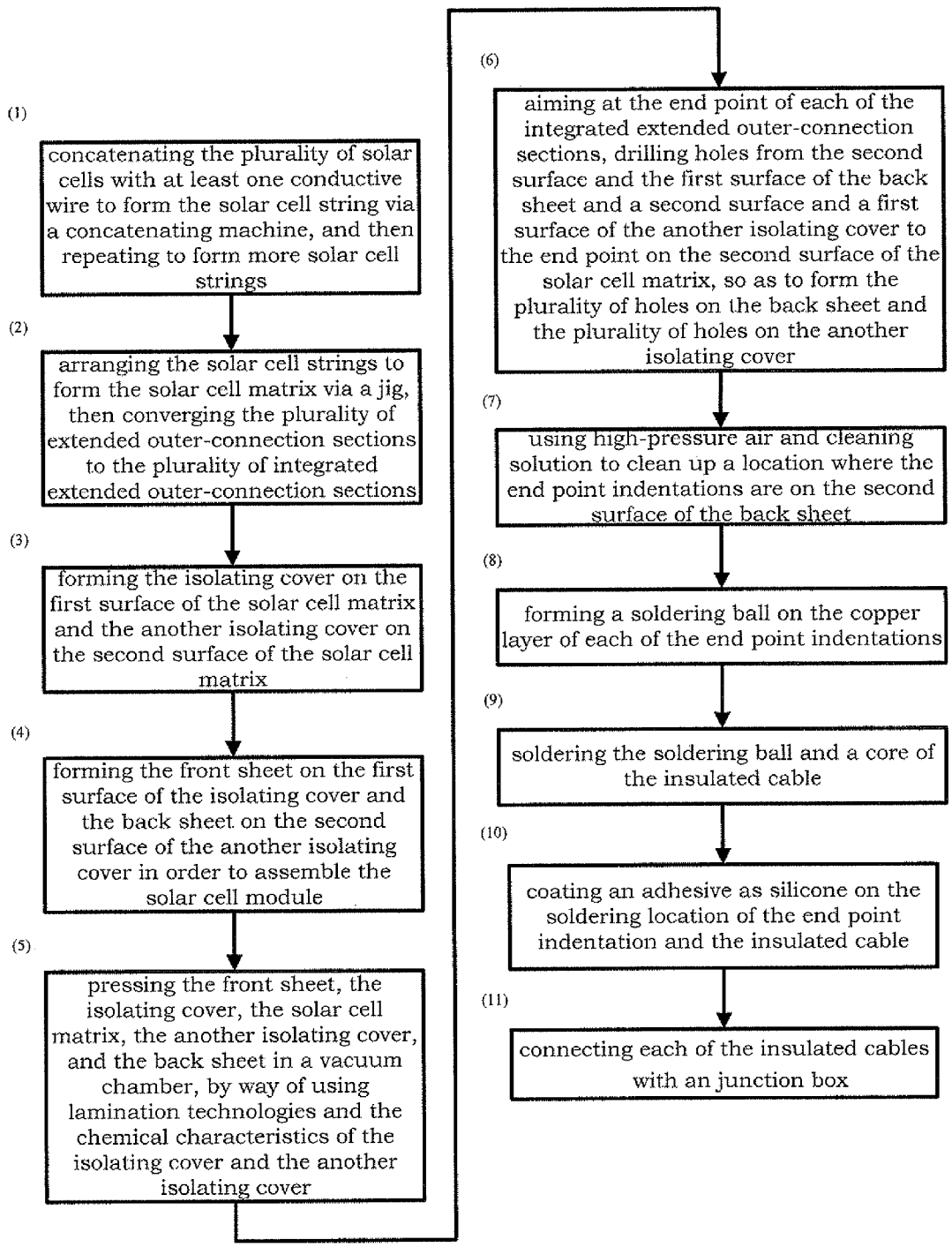
FIG. 11 illustrates a flow chart of the method for manufacturing the improved solar cell module of the present invention.
Figures 12A, 12B, 12C, 12D:
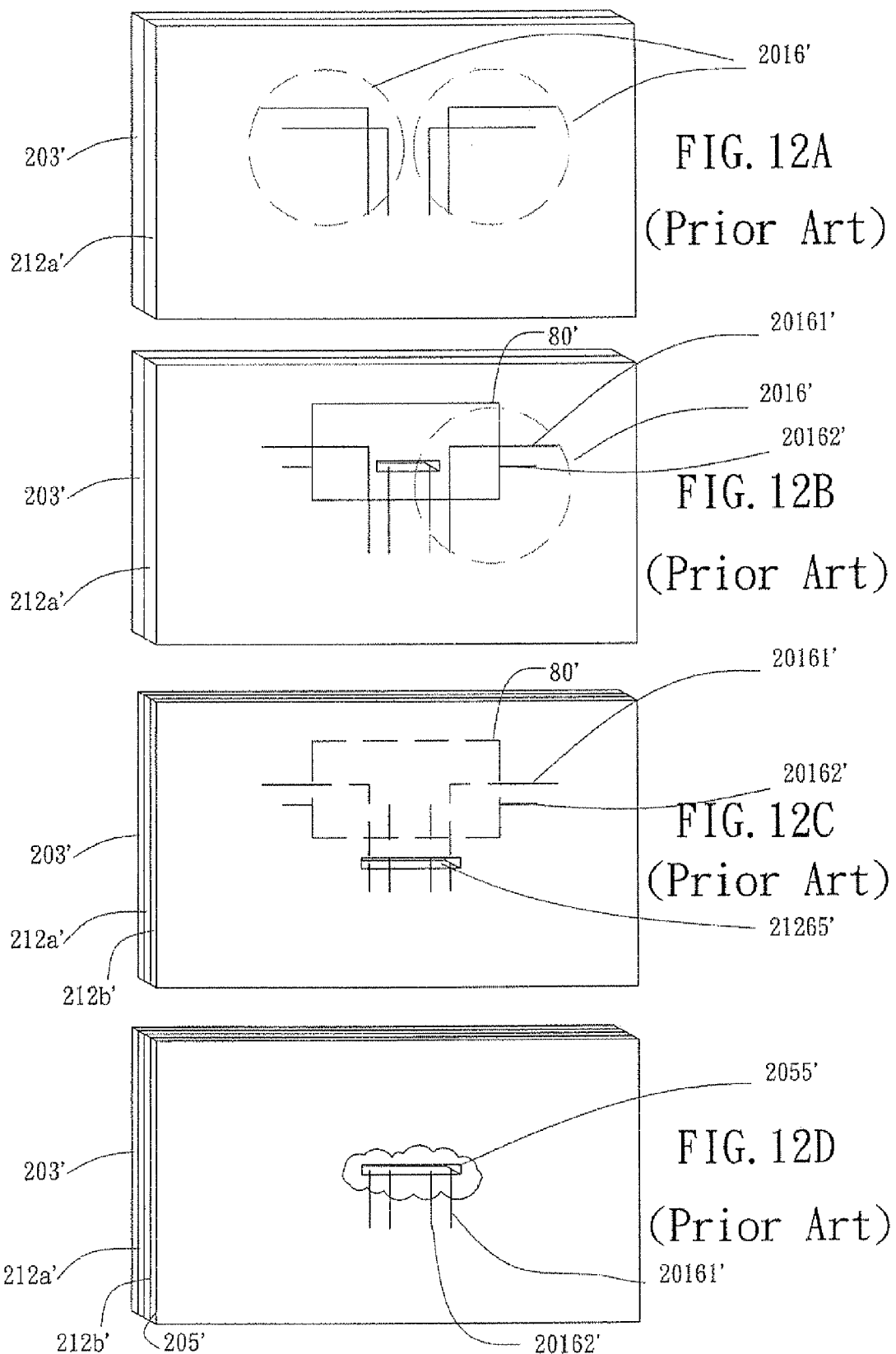
FIG. 12A to FIG. 12D illustrate schematic sequential views of forming an isolating member between conductive wires to prevent problems of power leakage and short circuit in prior arts.

(11) as shown in FIG. 10, connecting each of the insulated cables 206 with an junction box E;

wherein the isolating cover 212a and the another isolating cover 212b are made by one of ethylene-vinyl acetate (EVA), polytetrafluoroethylene (PTFE) and casting resin, and the front sheet 203 and the back sheet 205 are made by one of polymethyl methacrylate (PMMA), polytetrafluoroethylene (PTFE), polyethylene terephthalate (PET), glass, and plastic.

Compared to prior arts, the present invention does solve the shortcomings and those advantages are listed below:

1. There are no punches for through holes in the method provided by the present invention, and therefore the sealing after lamination process shall approach a standard. And once the lamination process is finished, following steps will be always the processes of sealing.
2. In order to avoid the solar cell strings from shifting during ribbons, end points of the conductive wires, going through the holes, the lamination process is done right after the solar cell matrix is finished. Hence, the sequences of the method may also prevent power leakage and short circuit.
3. In prior arts, a pre-process to vertically bend conductive wires is convenient to electrically connect with a junction box, and it takes time to manufacturing, hence the cost to manufacturing is being raised. The method of the present invention omits the process.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims

What is claimed is:

1. A method for manufacturing an improved solar cell module comprising the steps of:
    (1) concatenating a plurality of solar cells (2014) with a plurality of conductive wires (2016) to form a plurality of solar cell strings (2011), arranging the solar cell strings (2011) to form a solar cell matrix (201), and extending each conductive wire (2016) to form an extended outer-connection section (11X), then converging the plurality of extended outer-connection sections (11X) to a plurality of integrated extended outer-connection sections (11XT), wherein the number of the integrated extended outer-connection sections (11XT) is less than the number of the extended outer-connection sections (11X);
    (2) forming an isolating cover (212a) on a first surface (201A) of the solar cell matrix (201) and another isolating cover (212b) on a second surface (201B) of the solar cell matrix (201);
    (3) forming a front sheet (203) on a first surface (212a1) of the isolating cover (212a) and a back sheet (205) on a second surface (212b2) of the another isolating cover (212b) in order to assemble the solar cell module (20);
    (4) pressing the front sheet (203), the isolating cover (212a), the solar cell matrix (201), the another isolating cover (212b), and the back sheet (205) by way of using lamination technologies and the chemical characteristics of the isolating cover (212a) and the another isolating cover (212b);
    (5) aiming at an end point (11XTP) of each of the integrated extended outer-connection sections (11XT), drilling holes from the back sheet (205) and the another isolating cover (212b) to the end point (11XTP) on the second surface (201B) of the solar cell matrix (201), so as to form a plurality of holes (2052) on the back sheet (205) and a plurality of holes (2042) on the another isolating cover (212b), wherein each of the end points (11XTP) is not drilled through and therefore a plurality of end point indentations (11XTPH) are formed on the second surface (201B) of the solar cell matrix (201);
    (6) soldering each of the end point indentations (11XTPH) and an insulated cable (206);
    (7) coating an adhesive (2054) on the soldering location of the end point indentation (11XTPH) and the insulated cable (206); and
    (8) connecting each of the insulated cables (206) with a junction box (E).

2. The method for manufacturing the improved solar cell module according to claim 1, wherein step (1) further comprises the steps of:
    (11) concatenating the plurality of solar cells (2014) with at least one conductive wire (2016) to form the solar cell string (2011) via a concatenating machine, and then repeating to form more solar cell strings (2011); and
    (12) arranging the solar cell strings (2011) to form the solar cell matrix (201) via a jig, the solar cell matrix (201) having a first surface (201A) and a second surface (201B), extending each conductive wire (2016) to form the extended outer-connection section (11X), then converging the plurality of extended outer-connection sections (11X) to the plurality of integrated extended outer-connection sections (11XT), wherein the number of the integrated extended outer-connection sections (11XT) is less than the number of the extended outer-connection sections (11X), the integrated extended outer-connection sections (11XT) being on the one side of the second surface (201B) of the solar cell matrix (201).

3. The method for manufacturing the improved solar cell module according to claim 1, wherein step (2) further comprises the step of:
    (21) forming the isolating cover (212a) on the first surface (201A) of the solar cell matrix (201) and the another isolating cover (212b) on the second surface (201B) of the solar cell matrix (201), wherein the isolating cover (212a) has a first surface (212a1) and a second surface (212a2) and the another isolating cover (212b) has a first surface (212b1) and a second surface (212b2), thus the second surface (212a2) of the isolating cover (212a) compounds into the first surface (201A) of the solar cell matrix (201), and the first surface (212b1) of the another isolating cover (212b) compounds into the second surface (201B) of the solar cell matrix (201).

4. The method for manufacturing the improved solar cell module according to claim 1, wherein step (3) further comprises the step of:
    (31) forming the front sheet (203) on the first surface (212a1) of the isolating cover (212a) and the back sheet (205) on the second surface (212b2) of the another isolating cover (212b) in order to assemble the solar cell module (20), wherein the front sheet (203) has a first surface (2031) and a second surface (2032), and the back sheet (205) has a first surface (2051) and a second surface (2052'), thus the second surface (2032) of the front sheet (203) compounds into the first surface (212a1) of the isolating cover (212a), and the first surface (2051) of the back sheet (205) compounds into the second surface (212b2) of the another isolating cover (212b).

5. The method for manufacturing the improved solar cell module according to claim 1, wherein step (5) further comprises the step of:

(51) aiming at the end point (11XTP) of each of the integrated extended outer-connection sections (11XT), drilling holes from a second surface (2052') and a first surface (2051) of the back sheet (205) and a second surface (212b2) and a first surface (212b1) of the another isolating cover (212b) to the end point (11XTP) on the second surface (201B) of the solar cell matrix (201), so as to form the plurality of holes (2052) on the back sheet (205) and the plurality of holes (2042) on the another isolating cover (212b), wherein each of the end points (11XTP) is not drilled through so as to leave a copper layer exposed in the end point indentation (11XTPH) and therefore the plurality of end point indentations (11XTPH) are formed on the second surface (201B) of the solar cell matrix (201).

6. The method for manufacturing the improved solar cell module according to claim 1, wherein a step between step (5) and step (6) is of: using high-pressure air and cleaning solution to clean up a location where the end point indentations (11XTPH) are on the second surface (2052') of the back sheet (205).

7. The method for manufacturing the improved solar cell module according to claim 1, wherein step (6) further comprises the steps of:

(61) forming a soldering ball (S) on a copper layer of each of the end point indentations (11XTPH); and

(62) soldering the soldering ball (S) and a core (2062) of the insulated cable (206).

8. The method for manufacturing the improved solar cell module according to claim 1, wherein the isolating cover (212a) and the another isolating cover (212b) are made by one of the group consisted of: ethylene-vinyl acetate (EVA), polytetrafluoroethylene (PTFE) and casting resin.

9. The method for manufacturing the improved solar cell module according to claim 1, wherein the front sheet (203) and the back sheet (205) are made by one of the group consisted of: polymethyl methacrylate (PMMA), polytetrafluoroethylene (PTFE), polyethylene terephthalate (PET), glass, and plastic.

10. The method for manufacturing the improved solar cell module according to claim 1, wherein step (4) is carried out in a vacuum chamber.

11. The method for manufacturing the improved solar cell module according to claim 1, wherein the adhesive (2054) is silicone.

* * * * *